(12) United States Patent
Tu et al.

(10) Patent No.: US 8,031,097 B2
(45) Date of Patent: *Oct. 4, 2011

(54) MULTIPLYING DIGITAL-TO-ANALOG CONVERTER FOR HIGH SPEED AND LOW SUPPLY VOLTAGE

(75) Inventors: Wei-Hsuan Tu, Hsinchu (TW); Tzung-Hung Kang, Hsinchu County (TW)

(73) Assignee: Mediatek Inc., Science-Based Industrial Park, Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 12/760,540

(22) Filed: Apr. 14, 2010

(65) Prior Publication Data

US 2010/0194614 A1    Aug. 5, 2010

Related U.S. Application Data

(63) Continuation of application No. 12/339,084, filed on Dec. 19, 2008, now Pat. No. 7,746,260.

(51) Int. Cl.
*H03M 1/66* (2006.01)
(52) U.S. Cl. .......................... 341/144; 327/91
(58) Field of Classification Search .......... 341/110–150; 327/91–94; 330/86
See application file for complete search history.

(56) References Cited

U.S. PATENT DOCUMENTS

| | | | | | |
|---|---|---|---|---|---|
| 4,631,522 | A | * | 12/1986 | Cabot | 341/118 |
| 5,369,406 | A | * | 11/1994 | Hughes | 341/135 |
| 5,835,039 | A | * | 11/1998 | Giacomini | 341/144 |
| 6,653,961 | B1 | * | 11/2003 | Gosser et al. | 341/144 |
| 7,268,720 | B1 | * | 9/2007 | Murden | 341/161 |
| 7,397,287 | B2 | * | 7/2008 | Makihara | 327/91 |

OTHER PUBLICATIONS

Bjornar Hernes, A 1.2V 220MS/s 10b Pipeline ADC Implemented in 0.13umDigital CMOS, Feb. 17, 2004.

* cited by examiner

*Primary Examiner* — Lam T Mai
(74) *Attorney, Agent, or Firm* — Winston Hsu; Scott Margo

(57) ABSTRACT

A multiplying digital-to-analog converter includes an operational amplifier (OP-amp) operated under a first power supply voltage and a second power supply voltage; an OP-amp input switch block coupled to a common mode voltage for selectively coupling the common mode voltage to input nodes of the OP-amp, wherein the common mode voltage is substantially equal to the first power supply voltage; a capacitor block coupled to the OP-amp input switch block; a sampling switch block coupled to the input signal for selectively coupling the input signal to the capacitor block; a reference voltage switch block coupled to the capacitor block for selectively coupling the reference signal to the capacitor block; and a feedback switch block coupled between the capacitor block and output nodes of the OP-amp.

13 Claims, 5 Drawing Sheets

MULTIPLYING DIGITAL-TO-ANALOG CONVERTER FOR HIGH SPEED AND LOW SUPPLY VOLTAGE

CROSS REFERENCE TO RELATED APPLICATIONS

This continuation application claims the benefit of U.S. patent application Ser. No. 12/339,084 (filed on Dec. 19, 2008), which is included herein by reference.

BACKGROUND

The present invention relates to a multiplying digital-to-analog converter (MDAC), and more particularly, to a high-speed low supply voltage MDAC.

In the field of analog-to-digital converter (ADC), a pipeline ADC is commonly employed in high speed and high-resolution analog-to-digital converting operations. One of the most important blocks in the pipeline ADC is the MDAC (Multiplying digital-to-analog converter). Conventionally, there are a plurality of MDACs in the pipeline ADC, and each MDAC is responsible for generating a residue for use in the MDAC in next stage. Furthermore, the MDAC normally consists of an operational amplifier, a capacitor block, and a switching block, wherein the capacitor block is utilized to sample an input signal for assisting the switching block, and the operational amplifier outputs the residue between the input signal and an output bit of a subADC of the pipeline ADC to the next MDAC.

According to prior art, the common mode voltages of the input signal and the output signal of the operational amplifier are set to VDD/2, wherein VDD is the supply voltage of the operational amplifier. In addition, each switch in the switching block consists of an NMOS transistor MN combined with a PMOS transistor MP as shown in FIG. 1. FIG. 1 is a diagram illustrating a switch 10 according to prior art. When the MDAC operates under a low supply voltage, such as VDD=1.2V, a dead-zone emerges at the switch 10 when the switch is in the on mode. Please refer to FIG. 2. FIG. 2 is a diagram illustrating a relationship between the input voltage VIN and transconductance G of the NMOS transistor MN and the PMOS transistor of the switch 10 in the on mode. A curve 11 represents the transconductance G of the NMOS transistor, while a curve 12 represents the transconductance G of the PMOS transistor. It can be seen in the diagram that a dead-zone appears when the input voltage VIN is located between a voltage VDD-VTN and a voltage |VTP|, wherein VTN is a threshold voltage of the NMOS transistor and |VTP| is the absolute threshold voltage of the PMOS transistor. In other words, the switch 10 has the dead zone if the supply voltage VDD is low. If this is the case, the capacitor block may not be able to sample the input signal correctly.

Since the common mode voltages of the input signal of the operational amplifier are set to VDD/2, the input stage of the operational amplifier should also be biased at VDD/2. It is very difficult, however, to design an input stage biased at VDD/2 when the VDD is the low supply voltage but the system still needs to operate at high speed. Therefore, designing a pipeline ADC that operates under a low supply voltage but at a high operating speed is a current challenge in the field.

SUMMARY OF THE INVENTION

One of the objectives of the present invention is therefore to provide a high-speed low supply voltage multiplying analog-to-digital converter (MDAC).

According to an embodiment of the present invention, a multiplying digital-to-analog converter (MDAC) is disclosed. The MDAC comprises an operational amplifier (OP-amp), an OP-amp input switch block, a capacitor block, a sampling switch block, a reference voltage switch block, and a feedback switch block. The operational amplifier (OP-amp) operates under a first power supply voltage and a second power supply voltage, wherein the first power supply voltage is higher than the second power supply voltage. The OP-amp input switch block is coupled to a common mode voltage for selectively coupling the common mode voltage to input nodes of the OP-amp, wherein a first voltage difference between the first power supply voltage and the common mode voltage is smaller than a second voltage difference between the common mode voltage and the second power supply voltage. The capacitor block is coupled to the OP-amp input switch block for sampling charges corresponding to an input signal or sampling charges corresponding to a reference signal. The sampling switch block is coupled to the input signal for selectively coupling the input signal to the capacitor block. The reference voltage switch block is coupled to the capacitor block for selectively coupling the reference signal to the capacitor block. The feedback switch block is coupled between the capacitor block and output nodes of the OP-amp for selectively coupling the output nodes of the OP-amp to the capacitor block. These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
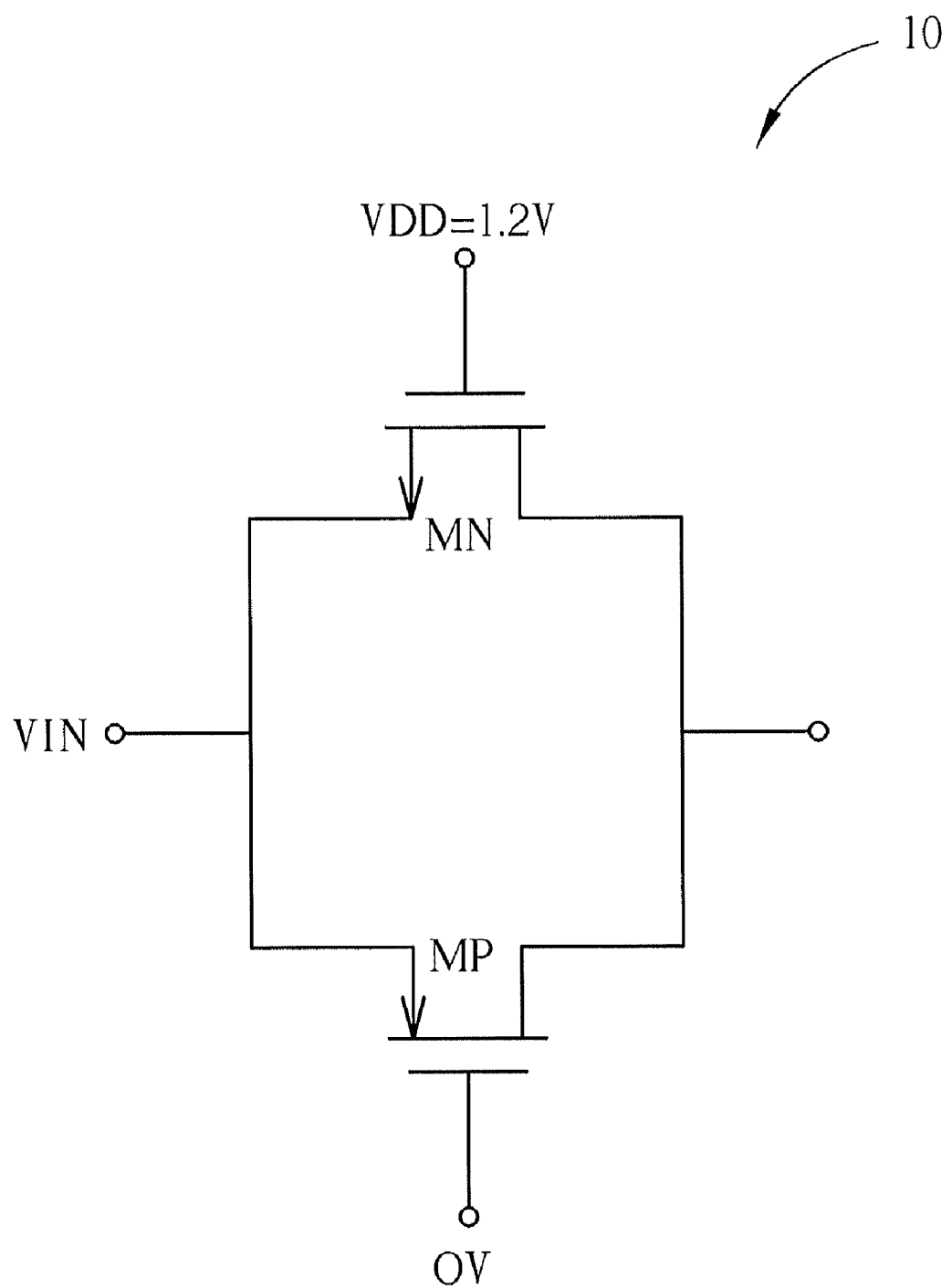
FIG. 1 is a diagram illustrating a switch according to prior art.
Figure 2:
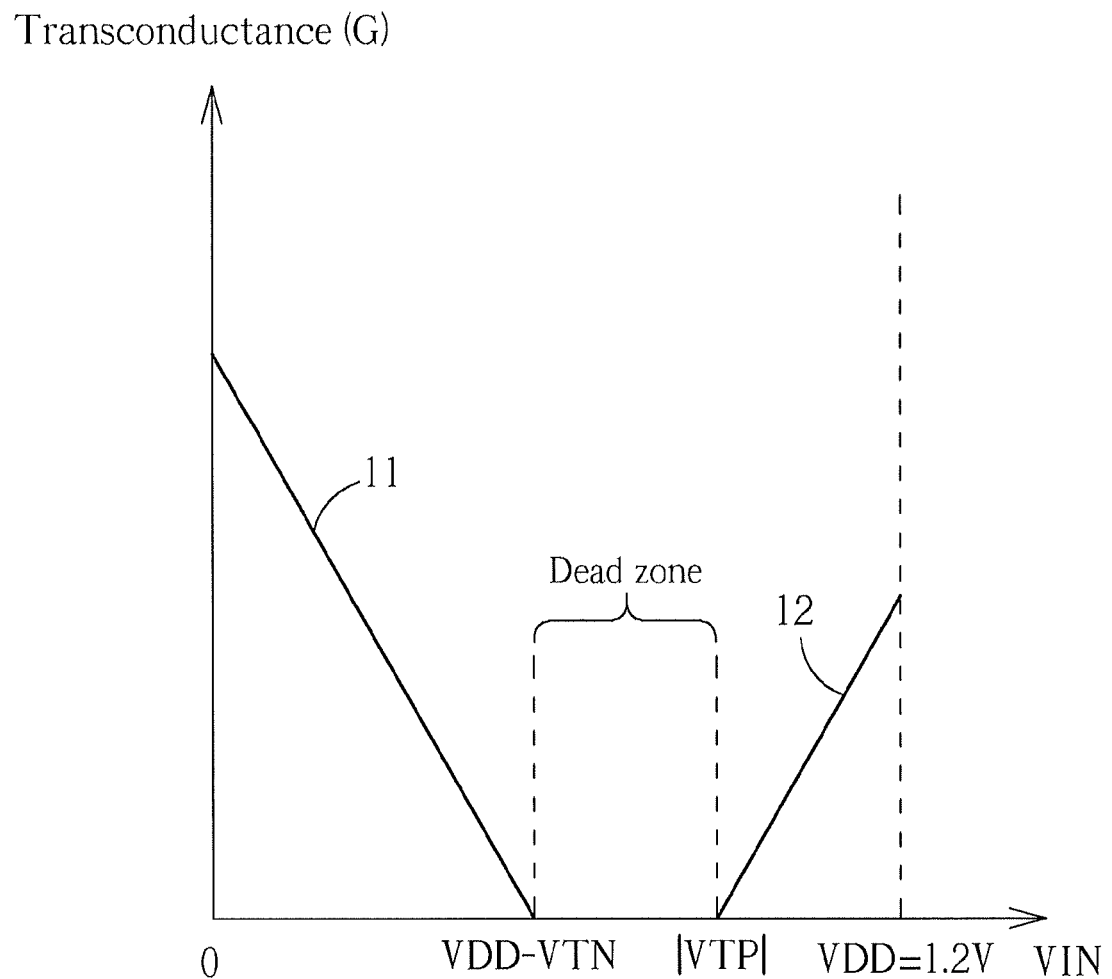
FIG. 2 is a diagram illustrating a relationship between an input voltage and transconductance G of the switch shown in FIG. 1.
Figure 3:
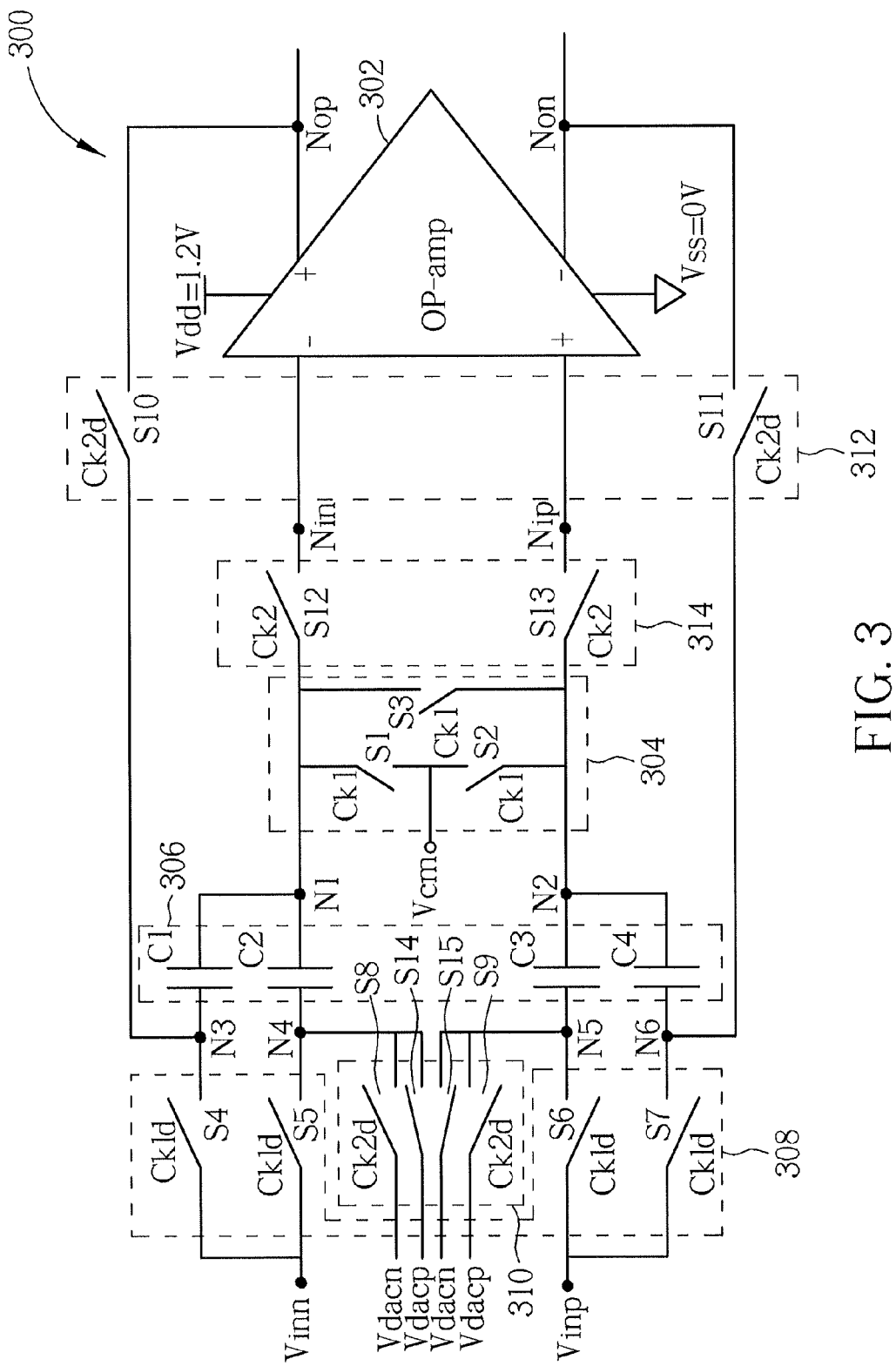
FIG. 3 is a diagram illustrating a multiplying digital-to-analog converter (MDAC) according to an embodiment of the present invention.

Please refer to FIG. 3. FIG. 3 is a diagram illustrating a multiplying digital-to-analog converter (MDAC) 300 according to an embodiment of the present invention. The MDAC 300 comprises a differential operational amplifier (OP-amp) 302, an OP-amp input switch block 304, a capacitor block 306, a sampling switch block 308, a reference voltage switch block 310, and a feedback switch block 312. The differential OP-amp 302 operates under a supply voltage Vdd and a ground voltage Vss. Please note that, in order to describe the spirit of the present invention more clearly, the supply voltage Vdd is a low voltage supply, e.g. 1.2V, and the ground voltage Vss is 0V.

The OP-amp input switch block 304 is coupled to a common mode voltage Vcm for selectively coupling the common mode voltage Vcm to input nodes Nip, Nin of the OP-amp 302, wherein all switches included in the OP-amp input switch block 304 are implemented utilizing PMOS transistors only in order to reduce the impedance and capacitance of the switch block 304. The capacitor block 306 is coupled to the OP-amp input switch block 304 for sampling charges corresponding to a differential input signal and sampling charges corresponding to a differential reference signal. The differential input signal has a first input signal Vinn and a second input signal Vinp. The sampling switch block 308 is coupled to the differential input signal for selectively coupling the differential input signal to the capacitor block 306. The reference voltage switch block 310 is coupled to the capacitor block 206 for selectively coupling a first reference voltage Vdacn or a second reference voltage Vdacp to the capacitor block 306 according to an output of a subADC (not shown). The feedback switch block 312 is coupled between the capacitor block 306 and output nodes Nop, Non of the OP-amp 302 for selectively coupling the output nodes Nop, Non of the OP-amp 302 to the capacitor block 306. According to the embodiment of the present invention, the MDAC 300 is configured as an OP sharing configuration, therefore the MDAC further comprises an OP-amp sharing switch block 314; however, this is not a limitation of the present invention. The OP-amp sharing switch block 314 is coupled between the input nodes Nip, Nin of the differential OP-amp 302 and the OP input switch block 304 for selectively connecting the input nodes Nip, Nin of the differential OP-amp 302 to the OP input switch block 304 when the MDAC 300 enters a hold phase, or for disconnecting the input nodes Nip, Nin of the differential OP-amp 302 from the OP input switch block 304 when the MDAC 300 enters a sampling phase, wherein all switches included in the OP-amp sharing switch block 314 are implemented utilizing PMOS transistors only.

Furthermore, the common mode voltage Vcm is set to substantially equal the supply voltage Vdd. Similarly, this is not a limitation of the present invention. In other words, the common mode voltage Vcm is chosen to conform to a condition where a first voltage difference between the supply voltage Vdd and the common mode voltage Vcm is smaller than a second voltage difference between the common mode voltage Vcm and the ground voltage Vss. More specifically, the common mode voltage Vcm can be chosen to conform to the condition where the first voltage difference is less than a quarter of a difference between the supply voltage Vdd and the ground voltage Vss, and the second voltage difference is not less than three quarters of the difference between the supply voltage Vdd and the ground voltage Vss.

Please refer to FIG. 3 again. As seen in the diagram, the OP-amp input switch block 304 comprises a PMOS switch S1, a PMOS switch S2, and a PMOS switch S3. The PMOS switches S1, S2, and S3 are controlled by a clock CK1, wherein the PMOS switch S1 is coupled between a node N1 and the common mode voltage Vcm, the PMOS switch S2 is coupled between a node N2 and the common mode voltage Vcm, and the PMOS switch S3 is coupled between the node N1 and the node N2.

The capacitor block 306 comprises capacitors C1, C2, C3, C4, wherein the capacitor C1 is coupled between the node N3 and the node N1, the capacitor C2 is coupled between the node N4 and the node N1, the capacitor C3 is coupled between the node N5 and the node N2, and the capacitor C4 is coupled between the node N6 and the node N2.

The sampling switch block 308, which is controlled by a clock CK1d, comprises a native NMOS switch S4, a native NMOS switch S5, a native NMOS switch S6, and a native NMOS switch S7, wherein the native NMOS switch S4 is coupled between the first input signal Vinn and the node N3, the native NMOS switch S5 is coupled between the first input signal Vinn and the node N4, the native NMOS switch S6 is coupled between the second input signal Vinp and the node N5, and the native NMOS switch S7 is coupled between the second input signal Vinp and the node N6. Generally the native NMOS has a low threshold voltage $V_{TN}$, which is about 0.1-0.2V.

The reference voltage switch block 310, which is controlled by a clock CK2d, comprises a NMOS switch S8, a PMOS switch S9, a NMOS switch S15, and a PMOS switch S14, wherein the NMOS switch S8 is coupled between the first reference voltage Vdacn and the node N4, the PMOS switch S9 is coupled between the second reference voltage Vdacp and the node N5, the NMOS switch S15 is coupled between the first reference voltage Vdacn and the node N5, and the PMOS switch S14 is coupled between the second reference voltage Vdacp and the node N4.

The feedback switch block 312, which is controlled by the clock CK2d, comprises a native NMOS switch 510 and a native NMOS switch S11, wherein the native NMOS switch S10 is coupled between the output nodes Nop and the node N3, and the native NMOS switch S11 is coupled between the output nodes Non and the node N6.

The OP-amp sharing switch block 314, which is controlled by a clock CK2, comprises a PMOS switch S12 and a PMOS switch S13, wherein the PMOS switch S12 is coupled between the node N1 and the input nodes Nin, and the PMOS switch S13 is coupled between the node N2 and the input nodes Nip.

Figure 4:
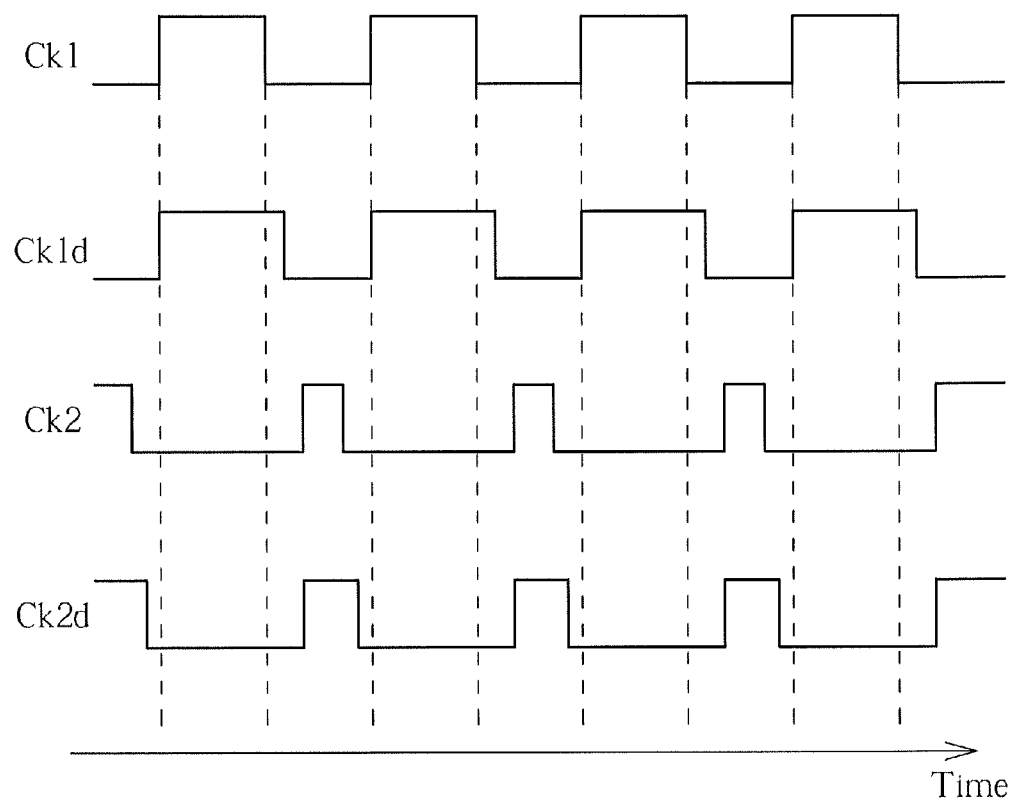
FIG. 4 is a timing diagram illustrating a clock CK1, a clock CK2, a clock CK1$d$, and a clock CK2$d$ of the MDAC shown in FIG. 2.

The clock CK1d is a delay version of the clock CK1, and the clock CK2d is a delay version of the clock CK2 as shown in FIG. 4, which is a timing diagram illustrating the clock CK1, the clock CK2, the clock CK1d, and the clock CK2d of the MDAC 300 as shown in FIG. 3. That is, the rising edges of the clock CK1 and clock CK1d are aligned, but the falling edges of the clock CK1d is later than that of the clock CK1; the rising edges of the clock CK2 and clock CK2d are aligned, but the falling edges of the clock CK2d is later than that of the clock CK2. Furthermore, the clock CK1 is non-overlapped with the clock CK2, while the clock CK1d is non-overlapped with the clock CK2d. The high voltage level of the clocks CK1, CK2, CK1d, CK2d is the same as the supply voltage Vdd, i.e., 1.2V; and the low voltage level is the same as the ground voltage Vss, i.e., 0V. When the clock CK1/CK1d is in the high level, the MDAC 300 is in the sampling phase, and when the clock CK2/CK2d is in the high level, the MDAC 300 is in the hold phase.

Figure 5:
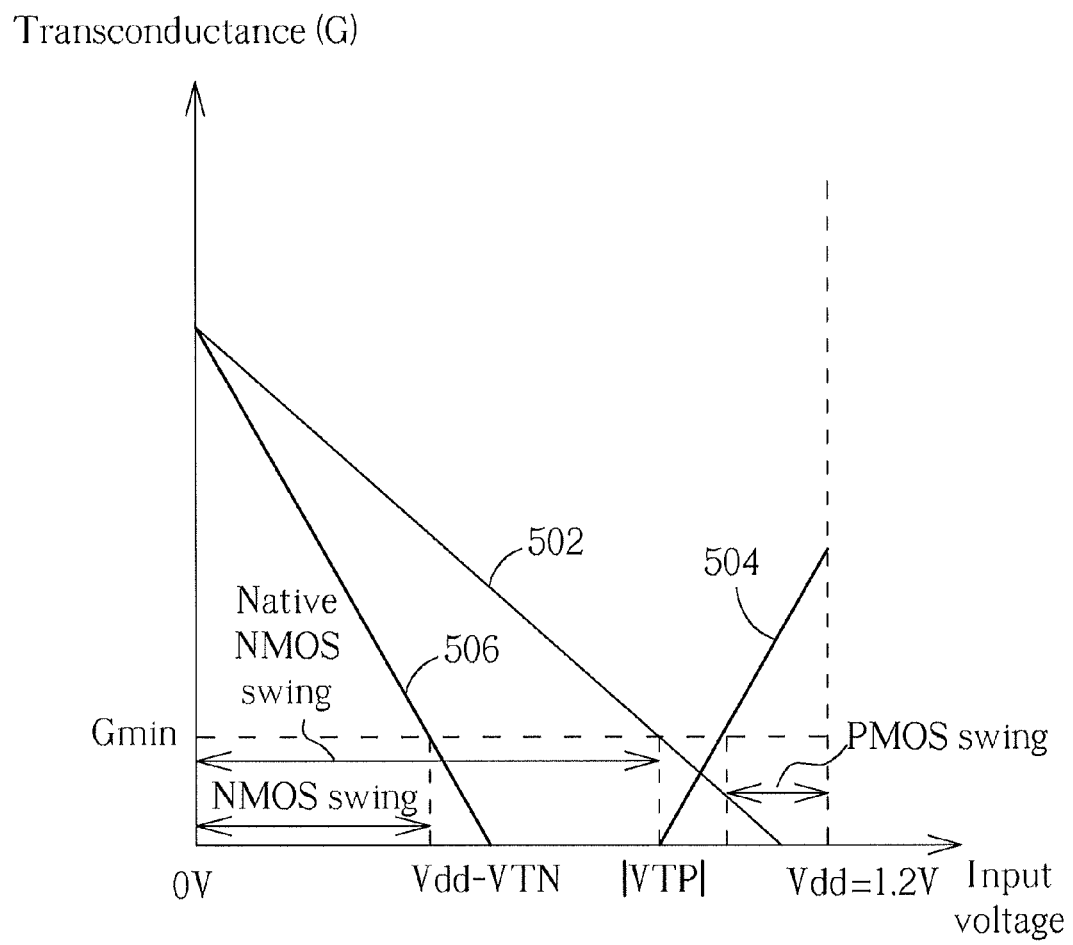
FIG. 5 is a diagram illustrating a relationship between the input voltage and a transconductance G of a native NMOS switch and a PMOS switch in a turn-on condition.

When the common mode voltage Vcm is set to substantially equal the supply voltage Vdd, an input stage of the differential OP-amp 302 should also be designed to bias at the supply voltage Vdd. Therefore, the PMOS switches S1, S2, and S3 have a good switching characteristic when turned on by the clock CK1. Similarly, the PMOS switches S12 and S13 also have a good switching characteristic when turned on by the clock CK2. Please refer to FIG. 5. FIG. 5 is a diagram illustrating a relationship between the input voltage and a transconductance G of a native NMOS switch and a PMOS switch in a turn-on condition. A curve 502 represents the transconductance G of the native NMOS switch, a curve 504 represents the transconductance G of the PMOS switch, and a curve 506 represents the transconductance G of the NMOS switch. It can be seen from the diagram that the curve 504 has a comparatively ideal transconductance G when the common mode voltage Vcm is substantially equal to the supply voltage Vdd, i.e., 1.2V. On the other hand, the transconductance G of the native NMOS switches S4, S5, S6, and S7 in the sampling switch block 308 is represented by the curve 502 in FIG. 5, and has a comparatively ideal transconductance G because the threshold voltage $V_{TN}$ is small. However, since the differential input signal is a varying signal, the present invention is not limited to only utilizing the native NMOS transistor to implement the switches in the sampling switch block 308. In another embodiment of the present invention, each switch (including the sampling switch block 308) is implemented utilizing a native NMOS transistor parallel with a PMOS transistor. Therefore, the transconductance G can be viewed as a combination of the curve 502 and the curve 504, which has no dead zone in the range from 0V to the supply voltage Vdd.

When the reference voltage switch block 310 is turned on by the clock CK2d, the NMOS switch S8 that couples the first reference voltage Vdacn to the node N4 has a transconductance G represented by the curve 506. The PMOS switch S9 that couples the second reference voltage Vdacp to the node N5 has a transconductance G represented by the curve 504. Please note that this is not a limitation of the present invention; another embodiment of the reference voltage switch block 310 of the present invention utilizes the NMOS transistor to couple the first reference voltage Vdacn to the node N4 and utilizes the native NMOS transistor to couple the second reference voltage Vdacp to the node N5, which can reduce the number of control logics and the routings of an analog-to-digital (ADC) system.

Furthermore, when the feedback switch block 312 is turned on by the clock CK2d, the transconductance G of the native NMOS switches S10 and S11 is also represented by the curve 502 in FIG. 5. However, the present invention is not limited to only utilizing the native NMOS transistor to implement the switches in the feedback switch block 312. In another embodiment of the present invention, each switch (including the feedback switch block 312) is implemented utilizing a native NMOS transistor combined with a PMOS transistor. Therefore, the transconductance G can be viewed as a combination of the curve 502 and the curve 504, which has no dead zone in the range from 0V to the supply voltage Vdd.

In summation, the present invention sets a common mode voltage Vcm that is substantially equal to the supply voltage, which considerably eases the designing of the input stage of a differential OP-amp under a high speed and low voltage supply system.

Those skilled in the art will readily observe that numerous modifications and alterations of the device and method may be made while retaining the teachings of the invention.

What is claimed is:

1. A multiplying digital-to-analog converter (MDAC), comprising:
   an operational amplifier (OP-amp), operated under a first power supply voltage and a second power supply voltage, wherein the first power supply voltage is higher than the second power supply voltage;
   an OP-amp input switch block, coupled to a common mode voltage, for selectively coupling the common mode voltage to input nodes of the OP-amp, wherein a first voltage difference between the first power supply voltage and the common mode voltage is smaller than a second voltage difference between the common mode voltage and the second power supply voltage;
   a capacitor block, coupled to the OP-amp input switch block, for sampling charges corresponding to an input signal or sampling charges corresponding to a reference signal;
   a sampling switch block, coupled to the input signal, for selectively coupling the input signal to the capacitor block;
   a reference voltage switch block, coupled to the capacitor block, for selectively coupling the reference signal to the capacitor block; and
   a feedback switch block, coupled between the capacitor block and output nodes of the OP-amp, for selectively coupling the output nodes of the OP-amp to the capacitor block.

2. The MDAC of the claim 1, wherein the first voltage difference is less than one-fourth of a difference between the first power supply voltage and the second power supply voltage, and the second voltage difference is not less than three-fourths of the difference between the first power supply voltage and the second power supply voltage.

3. The MDAC of claim 1, wherein the common mode voltage is substantially equal to the first power supply voltage.

4. The MDAC of the claim 1, further comprising:
   an OP-amp sharing switch block, coupled between the input nodes of the OP-amp and the OP input switch block, for selectively connecting the input nodes of the OP-amp to the OP input switch block when the MDAC enters a hold phase, or for disconnecting the input nodes of the OP-amp from the OP input switch block when the MDAC enters a sampling phase, wherein all switches included in the OP-amp sharing switch block are implemented utilizing PMOS transistors only.

5. The MDAC of the claim 1, wherein all switches included in the sampling switch block are implemented utilizing native NMOS transistors only.

6. The MDAC of the claim 1, wherein each switch included in the sampling switch block is implemented utilizing at least a native NMOS transistor combined with at least a PMOS transistor.

7. The MDAC of the claim 1, wherein the reference voltage switch block comprises:
   a first switch, coupled between a first reference voltage and the capacitor block, wherein the first switch is implemented utilizing at least a PMOS transistor, and no NMOS transistor is included in the first switch; and
   a second switch, coupled between a second reference voltage and the capacitor block, wherein the first reference voltage is different with the second reference voltage, the second switch is implemented utilizing an NMOS transistor, and no PMOS transistor is included in the second switch.

8. The MDAC of the claim 7, wherein the first reference voltage is higher than the second reference voltage.

9. The MDAC of the claim 1, wherein the reference voltage switch block comprises:
   a first switch, coupled between a first reference voltage and the capacitor block, wherein the first switch is implemented utilizing at least a native NMOS transistor, and no PMOS transistor is included in the first switch; and a second switch, coupled between a second reference voltage and the capacitor block, wherein the first reference voltage is different with the second reference voltage, the second switch is implemented utilizing at least an NMOS transistor, and no PMOS transistor is included in the first switch.

10. The MDAC of the claim 9, wherein the first reference voltage is higher than the second reference voltage.

11. The MDAC of the claim 1, wherein all switches included in the feedback switch block are implemented utilizing native NMOS transistors only.

12. The MDAC of the claim 1, wherein each switch included in the feedback switch block is implemented utilizing at least a native NMOS transistor combined with at least a PMOS transistor.

13. The MDAC of the claim 1, wherein at least part of switches included in the OP-amp input switch block are implemented utilizing PMOS transistors.

* * * * *